United States Patent
Rice et al.

(10) Patent No.: US 8,078,304 B2
(45) Date of Patent: Dec. 13, 2011

(54) DUAL-MODE ROBOT SYSTEMS AND METHODS FOR ELECTRONIC DEVICE MANUFACTURING

(75) Inventors: Michael R. Rice, Pleasanton, CA (US); Jeffrey C. Hudgens, San Francisco, CA (US); Todd J. Egan, Fremont, CA (US); Ingrid B. Peterson, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 240 days.

(21) Appl. No.: 12/176,381

(22) Filed: Jul. 20, 2008

(65) Prior Publication Data

US 2009/0024241 A1 Jan. 22, 2009

Related U.S. Application Data

(60) Provisional application No. 60/951,149, filed on Jul. 20, 2007.

(51) Int. Cl.
*G06F 19/00* (2011.01)
(52) U.S. Cl. .......... 700/112; 700/245; 414/222.08; 414/935
(58) Field of Classification Search .......... 700/95, 700/108–110, 112–114, 121, 173, 174, 177, 700/195, 213, 228, 245, 250, 258; 414/222.01, 414/222.08, 222.13, 226.05, 806, 935, 940; 901/14–16, 27, 28, 33, 45, 46, 50; 702/33, 702/35, 81, 85, 127, 149, 150; 438/5, 14
See application file for complete search history.

(56) References Cited

U.S. PATENT DOCUMENTS

| | | | |
|---|---|---|---|
| 6,842,220 B1 | 1/2005 | Dishon et al. | |
| 6,853,873 B1 | 2/2005 | Rollo et al. | |
| 6,856,863 B1 | 2/2005 | Sundar | |
| 6,927,181 B2* | 8/2005 | Wakizako et al. | 414/940 |
| 7,008,884 B2* | 3/2006 | Wakizako et al. | 414/935 |
| 7,100,340 B2* | 9/2006 | Bonora et al. | 414/935 |
| 7,217,076 B2* | 5/2007 | Bonora et al. | 414/939 |
| 7,249,992 B2 | 7/2007 | Kalenian et al. | |
| 7,264,436 B2* | 9/2007 | Tillmann | 414/806 |
| 7,406,360 B2* | 7/2008 | Machiyama | 700/112 |
| 7,678,417 B2* | 3/2010 | Hara et al. | 414/935 |
| 2004/0067127 A1* | 4/2004 | Hofmeister et al. | 414/744.5 |
| 2005/0036863 A1* | 2/2005 | Wakizako et al. | 414/936 |
| 2007/0081881 A1* | 4/2007 | Okuno et al. | 414/217 |

OTHER PUBLICATIONS

International Search Report and Written Opinion of International Application No. PCT/US08/08779 (12563-PCT) mailed Oct. 30, 2008.
International Preliminary Report on Patentability and Written Opinion of International Application No. PCT/US08/008779 (12563-PCT) mailed Feb. 4, 2010.

* cited by examiner

*Primary Examiner* — Charles Kasenge
(74) *Attorney, Agent, or Firm* — Dugan & Dugan, PC

(57) ABSTRACT

Electronic device manufacturing systems and methods are provided. In some aspects, a system having a dual-mode robot is provided which is disposed within a system component (e.g., a factory interface or transfer chamber) and adapted to operate in a first mode and a second mode. In the first mode, the robot may transfer a substrate between components of the system (e.g., between a carrier and a process chamber or chamber to chamber) and in the second mode, the robot may execute a process motion profile (e.g., metrology).

19 Claims, 12 Drawing Sheets

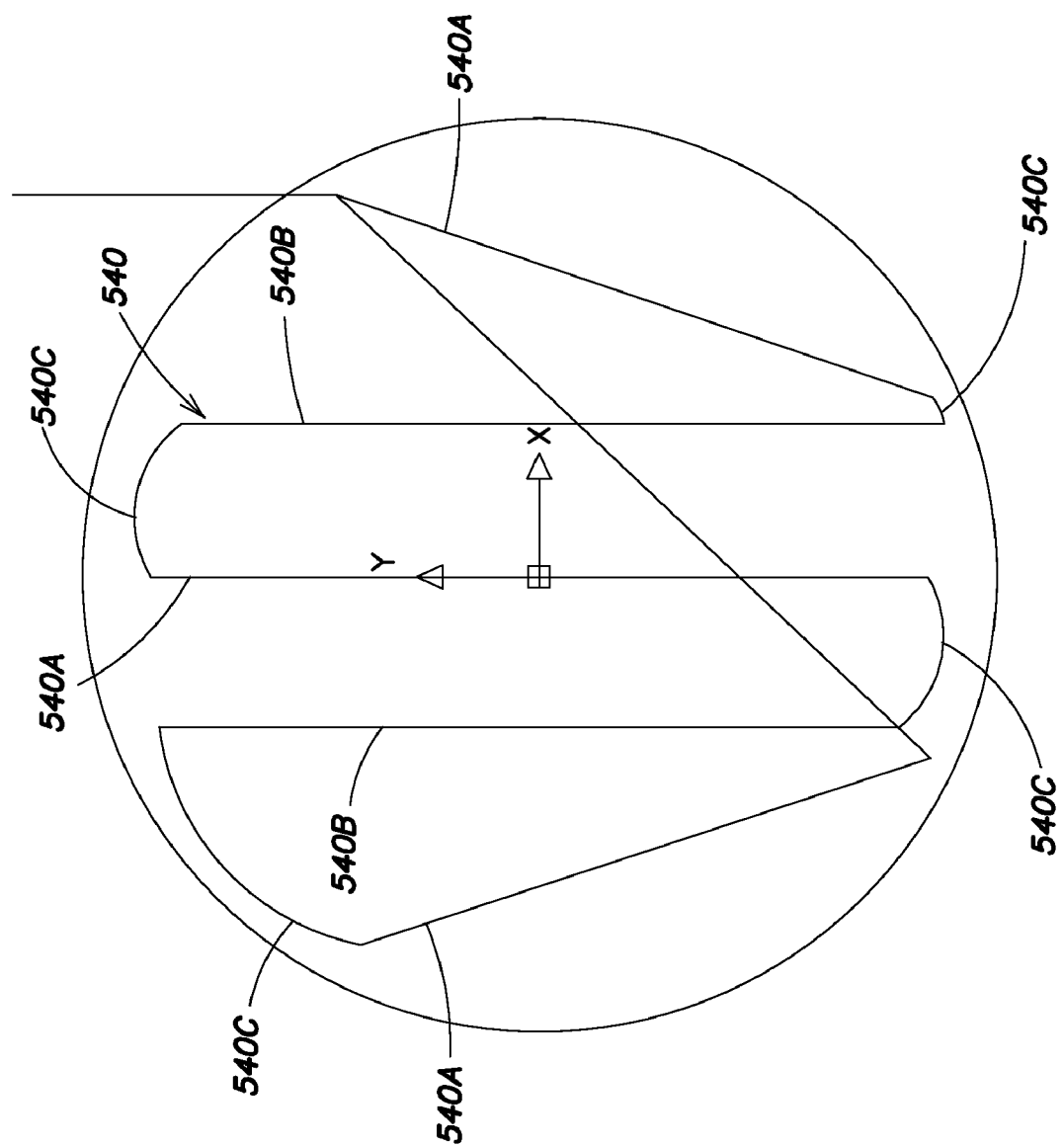

DUAL-MODE ROBOT SYSTEMS AND METHODS FOR ELECTRONIC DEVICE MANUFACTURING

RELATED APPLICATIONS

The present application claims priority to U.S. Provisional Patent Application No. 60/951,149 filed Jul. 20, 2007, and entitled "Dual-Mode Robot For Electronic Device Manufacturing" which is hereby incorporated herein by reference in its entirety for all purposes.

FIELD OF THE INVENTION

The present invention relates generally to electronic device manufacturing, and more particularly to robot systems and methods of manufacturing electronic devices using such robot systems.

BACKGROUND OF THE INVENTION

In the manufacture of electronic devices, robots may be used to move the substrates between various manufacturing system components, such as factory interfaces, substrate carriers (e.g., cassettes), and process chambers of process tools, for example. In order to maximize throughput, and, therefore, provide relatively low manufacturing cost, efficient transfer of substrates between system components is desired.

SUMMARY OF THE INVENTION

In a first aspect, an electronic device manufacturing system is provided including a factory interface adapted to receive a substrate carrier; a robot disposed within the factory interface and adapted to operate in a first mode and a second mode, wherein in the first mode, the robot is adapted to transfer a substrate between the substrate carrier and one or more tools, and wherein in the second mode, the robot is adapted to execute a process motion profile.

In a second aspect, an electronic device manufacturing system is provided, including a factory interface adapted to receive a substrate carrier; a robot disposed within the factory interface and adapted to operate in a first mode and a second mode, wherein in the first mode, the robot is adapted to transfer a substrate between the substrate carrier and one or more tools, and wherein in the second mode, the robot is adapted to function as a stage for performing metrology on the substrate; and a metrology sensor disposed within the factory interface and adapted to output information about the substrate when the robot operates in the second mode.

According to another aspect, the present invention provides a substrate transfer apparatus, including a robot disposed within a factory interface and adapted to operate in a transfer mode and a process mode, wherein in the transfer mode, the robot is adapted to transfer a substrate between a substrate carrier and one or more tools, and wherein in the process mode, the robot is adapted to function as a stage for performing a process on the substrate; and a process tool disposed within the reach of the robot operating in the process mode and adapted to apply a process to the substrate when the robot operates in the process mode.

According to a further aspect, the present invention provides a method for manufacturing an electronic device, comprising the steps of removing a substrate from a first system component selected from a group consisting of a tool, a substrate carrier, and a factory interface; transferring the substrate to a second system component selected from a group of a tool, a factory interface, and a substrate carrier; and performing metrology on the substrate as the substrate is transferred from the first system component to the second system component.

According to yet another aspect, the present invention provides a method of calibrating a robot, comprising the steps of calibrating a robot for transferring substrates; loading a metrology calibration substrate on the robot; locking the robot into a metrology motion profile; and calibrating the robot for performing metrology.

Other features and aspects of the present invention will become more fully apparent from the following detailed description, the appended claims and the accompanying drawings.

BRIEF DESCRIPTION OF THE DRAWINGS

FIGS. 5A to 5C depict examples of process motion profiles according to embodiments of the present invention.

DETAILED DESCRIPTION

Figure 1:
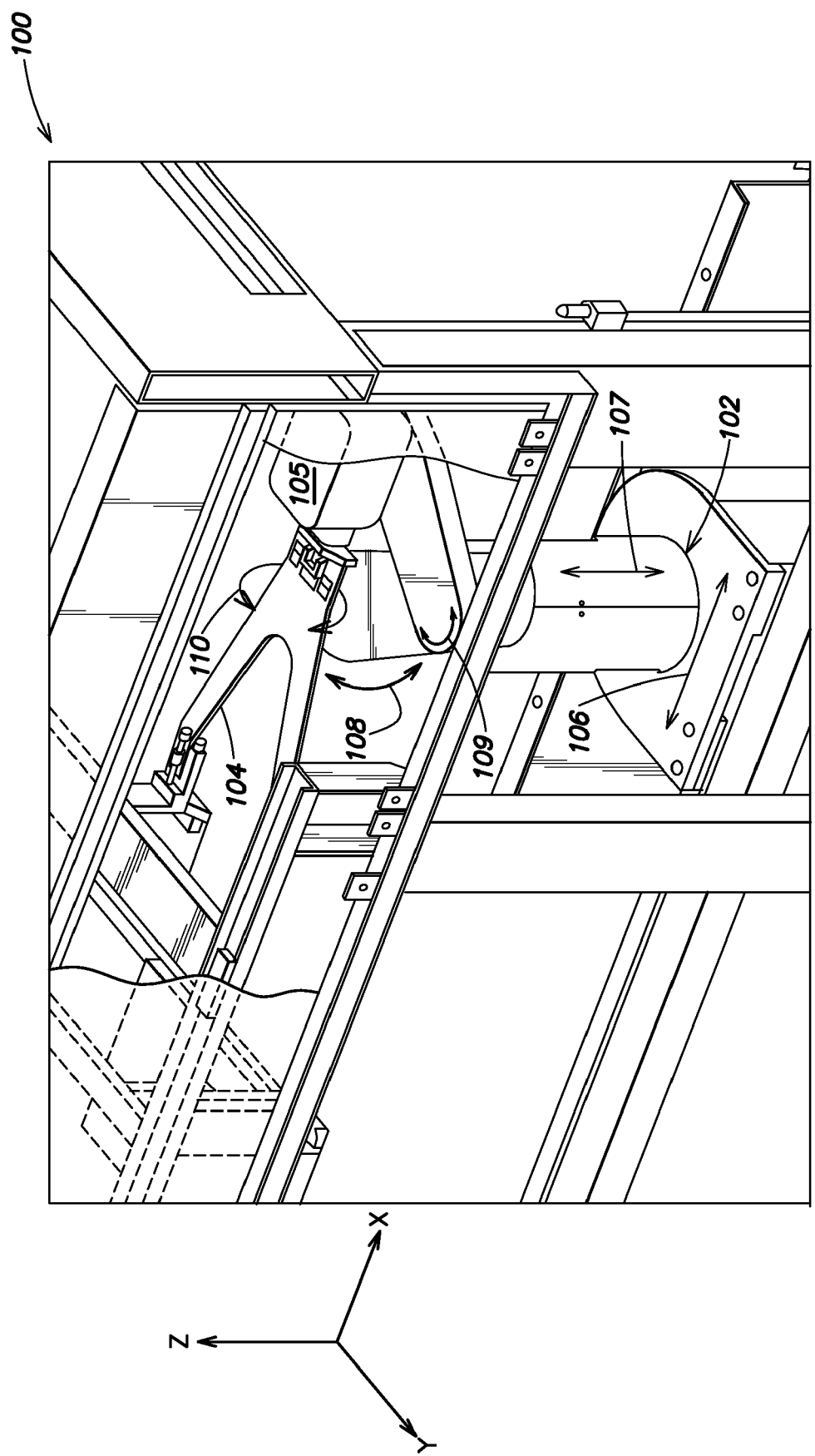
FIG. 1 is a perspective view of a robot within a factory interface adapted to function as both a transfer robot and as a process motion robot according to embodiments of the present invention.

Conventional transfer robots (e.g., those found in factory interfaces and transfer chambers) are adapted to move substrates between substrate carriers, process chambers, and other substrate processing or transfer stations/tools. Such robots typically have several joints or axes of motion that allow substrates to be positioned at almost any point within the robots' range of motion. Processing of the substrates is conventionally performed in dedicated tools that include motion stages used to precisely move the substrates (e.g., in an x-y plane) within the dedicated tools. Typically, the transfer robots hand off the substrates to the motion stages which perform a process motion profile during the processing. Thus, conventional electronic device manufacturing systems include both transfer robots and separate, dedicated motion stages for moving substrates according to a process motion profile within a process tool. Therefore, conventional systems require a footprint large enough to accommodate both a transfer robot and a motion stage. Additionally, the hand-off between the two transfer and motion stages reduces throughput while increasing the chance for error, contamination, and/or damage to the substrate.

In contrast, the present invention, in a first aspect, provides a dual-mode robot apparatus and system that is adapted to both transfer substrates between system components (e.g., a tool, substrate carrier, or factory interface) and to help perform one or more substrate processing functions. The substrate processing functions may include one or more motion-dependent processes selected from a group of metrology (e.g., measurement), defect inspection, film characterization, laser annealing, laser ablation, laser scribing, electron beam curing, other curing (e.g., UV, heat, etc.), inkjet printing, die or other component placement/registration/alignment manufacturing and/or packaging functions, etc. In other words, the robot apparatus and systems of the present invention are adapted to both function in a transfer mode (e.g., to move substrates from point to point, system component to system component) and also to function in a process motion mode (e.g., to precisely move the substrate according to a specific process motion profile while one or more processes are performed on the substrate).

In some embodiments, the present invention may enable a transfer robot apparatus and system to function as a motion stage by disabling one or more joints or axes of motion of the robot thereby restricting or limiting the robot to motion that is suitable for performing a motion-dependent process. For example, if a certain metrology process only requires a substrate to be moved under a sensor with two degrees of freedom (e.g., surging and yaw), other possible motions (e.g., heaving, swaying, pitching, and rolling) may be prevented. Motion may be prevented by locking the robot's joints except those that enable the robot to move the substrate forward and back along a horizontal plane (i.e., surging) and rotationally on the same horizontal plane (i.e., yaw). In some embodiments, one or more joints may be locked or unlocked for a portion of the motion-dependent process or for a setup/calibration phase or part of the process. For example, in order to initially focus a metrology sensor, it may be helpful to move the substrate vertically along the Z-axis (i.e., in a heaving motion). Thus, the vertical motion axis may be initially unlocked to allow, e.g., focusing and then locked during the remainder of the processing.

In such embodiments, a factory interface or a transfer chamber may include additional apparatus to facilitate the processing. In the above example, a factory interface may include a metrology sensor mounted within or above the restricted operating range of the robot (e.g., above the robot alley). In some embodiments, the robot apparatus and system of the present invention may operate in both transfer and process motion modes concurrently. For example, as a substrate is being transferred by a robot from a first system component to a second system component, such as from a substrate carrier to a process chamber of a tool, the robot may lock certain of the robot's joints and bring the substrate under a metrology sensor on the substrate's path to the process chamber. A metrology motion profile may then be executed by the robot, and then a delivery of the substrate to the process chamber may be completed. Thus, without having to hand off the substrate to a motion stage in a metrology tool, the robot of the present invention is able to concurrently transfer the substrate and perform a motion-dependent process on the substrate.

Therefore, the present invention may provide a number of useful benefits, such as: 1) throughput may be increased because the processing of a substrate may no longer requires a separate transfer into and out of a dedicated process chamber; 2) opportunities for contamination, particle generation, hand off errors, and alignment errors are avoided or minimized by avoiding hand offs between the robot and a motion stage; 3) the path of the substrate may not have to be altered to perform the process; 4) the overall manufacturing system may have a smaller footprint since the need for a dedicated processing tool (e.g., a metrology tool) may be eliminated; and more complex process motion profiles may be easily implemented since the robot has more degrees of freedom than conventional motion stages (e.g., the substrate may be inverted by a robot to allow processing of both sides of the substrate).

Turning to FIGS. 1-9, the above described example of a metrology process performed in a factory interface using a transfer robot as a motion stage is illustrated. However, it should be recognized that the present invention may be utilized in other transfer operations, such as with transfers occurring in a transfer chamber between a loadport or chamber and a processing chamber of a tool, for example. Numerous other embodiments are also described.

FIG. 1 depicts a perspective view of a factory interface 100 with a robot 102 adapted to function as both a transfer robot and a process stage. The robot 102 includes a blade 104 for supporting the substrate (not shown) during transfer and a motion-dependent process stage. The blade 104 is coupled to a wrist motor 105 which may accomplish the pitch motion of the blade. The arrows labeled 106-110 depict various degrees of motion that may be achieved and imparted to the blade 104 by the multi-axis robot 102.

In one embodiment, arrows labeled 107, 109, and 110 identify three joints of the robot 102 that may be fixed (e.g., the vertical shoulder motion, elbow, and wrist axes are locked), respectively. In the depicted embodiment, two joints labeled by arrows 108 and 106 may not be fixed (e.g., the rotation and track axes are moveable). In this configuration, the robot 102 may function as a motion stage to perform a motion-dependent process such as metrology, for example. In the described embodiment, precise motion of the blade and resident substrate (not shown) may be accomplished in an X-Y plane (see FIG. 1) relative to another component (e.g., a sensor, laser, e-beam, print head, etc.).

Figure 2:
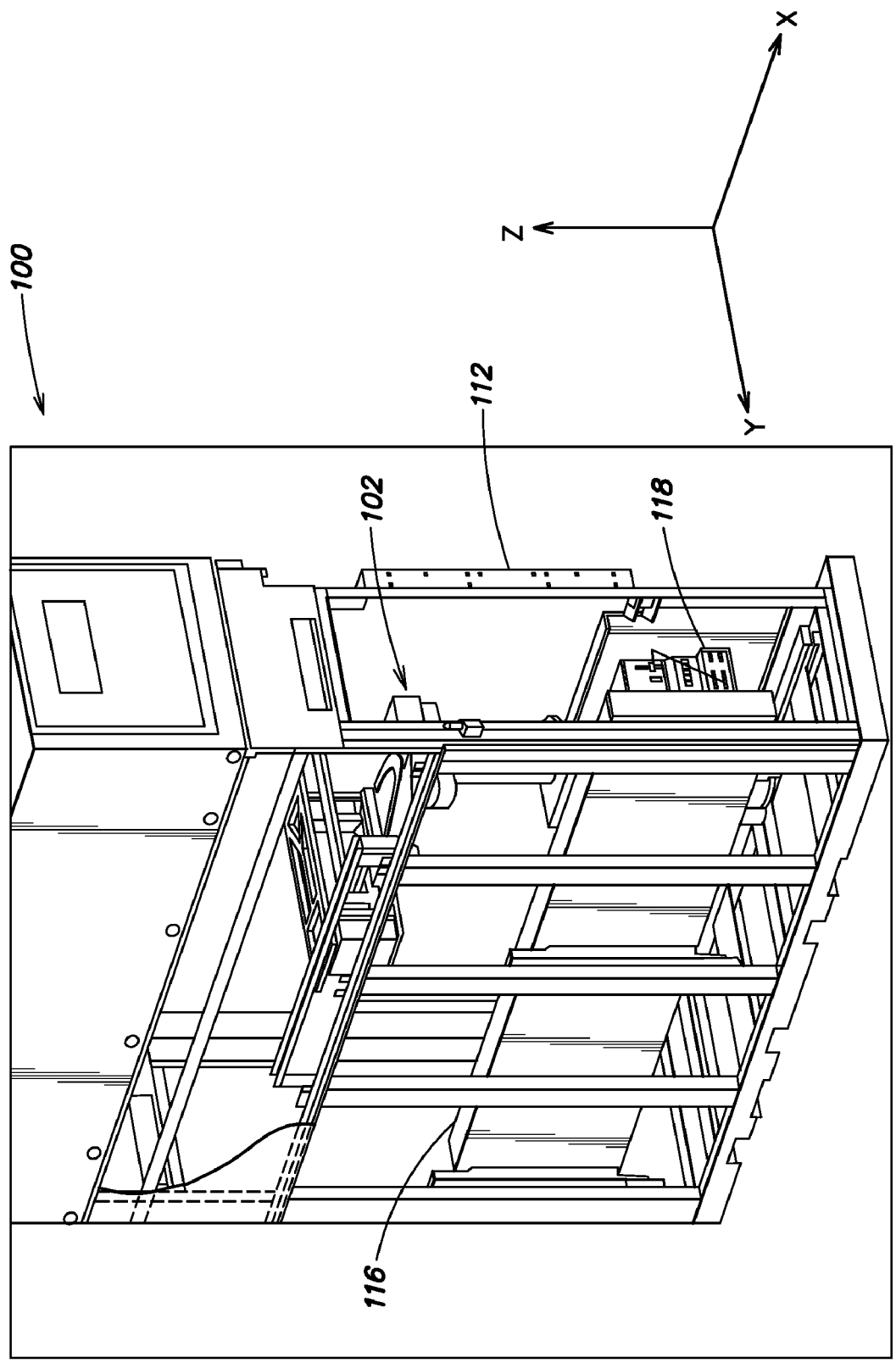
FIG. 2 is a perspective view of the factory interface of FIG. 1.
Figure 3:
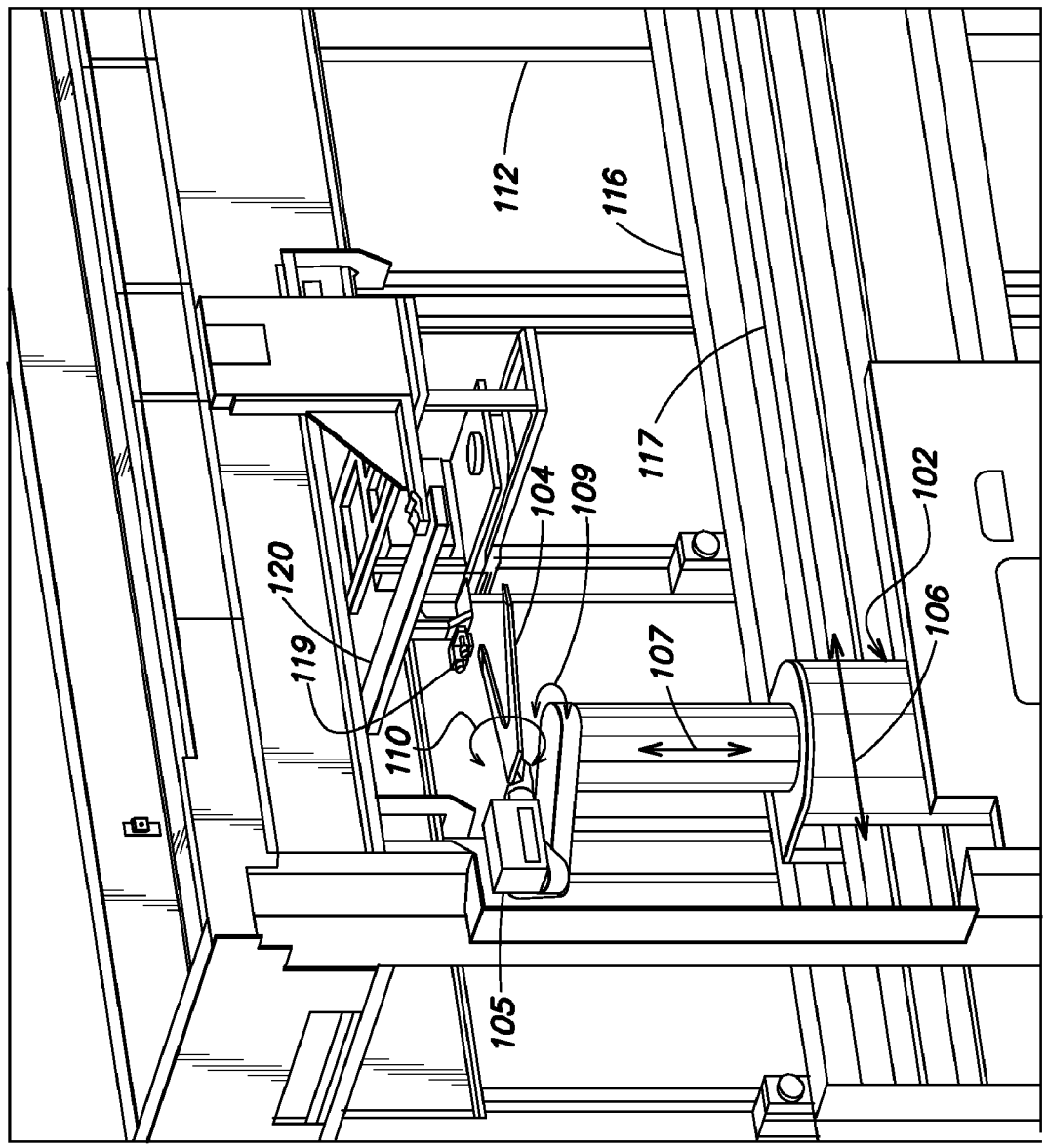
FIG. 3 is a second perspective view of the robot of FIG. 1.

FIG. 2 is a similar perspective view of the factory interface 100 but at a lesser magnification to better illustrate the factory interface components. As is depicted, the factory interface 100 may include a rigid frame 112 with the robot 102 being movably mounted to the frame by, for example, a precision slide 116 including horizontal tracks 117 (FIG. 3). The robot 102 may translate along the X direction along a path dictated by the precision slide 116. Motion along the Y direction may be accomplished by motion of the robot (e.g., by shoulder rotation of the robot 102). A servo system and servo mechanism 118 may cause the robot motion. However, any suitable multi-axis robot may be employed.

Figure 4:
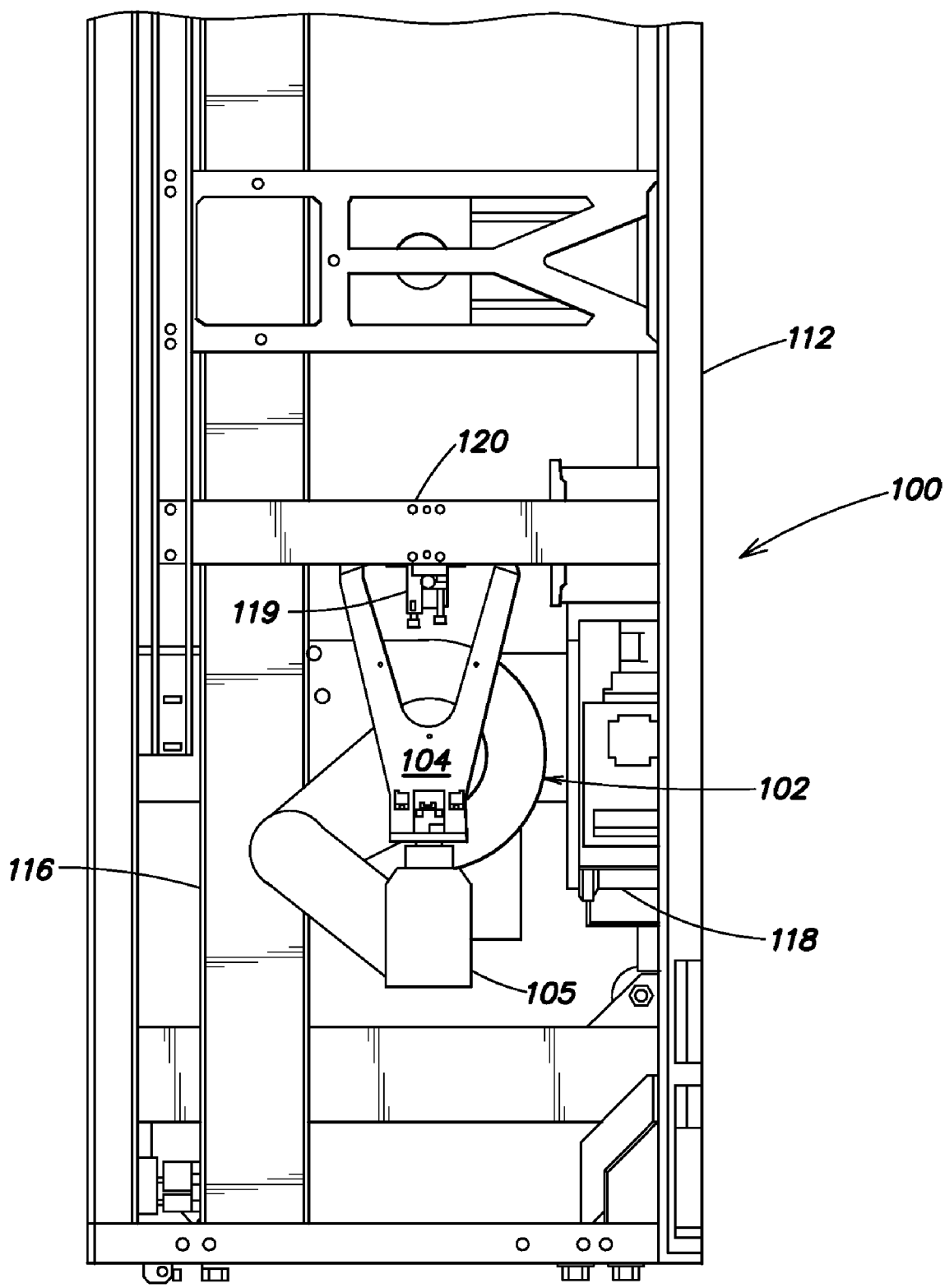
FIG. 4 is a top elevation view of the robot of FIG. 1.

FIGS. 3 and 4 (perspective and top views, respectively) most clearly depict the location of a metrology sensor 119, in this example embodiment, a white light (WL) sensor. The sensor 119 may be mounted from the frame 112 by sub-frame 120. In one embodiment, the sensor 119 may be mounted above the blade 104. Thus, motion of the robot 102 along a predefined process profile path may be used to carry out a metrology function. Additionally, the robot 102 may be adapted to transfer the substrate (not shown) from a first location in the factory interface 100 to a second location in the factory interface. Thus, the robot 102 may be adapted to operate in a first mode, carrying out a motion-dependent process (e.g., a metrology motion profile, an annealing scanning profile, an alignment motion profile, a film characterization motion profile, a defect inspection motion profile, a curing motion profile, a registration motion profile, or a die placement profile), and in a second mode, a transfer mode, concurrently. In the transfer mode, the substrate (not shown) is transported from one system component to another system component within the factory interface 100. For example, the robot 102 may be adapted to transfer the substrate from a substrate carrier to a process chamber of one or more tools as discussed in more detail with reference to FIG. 9 below.

Figure 5A:
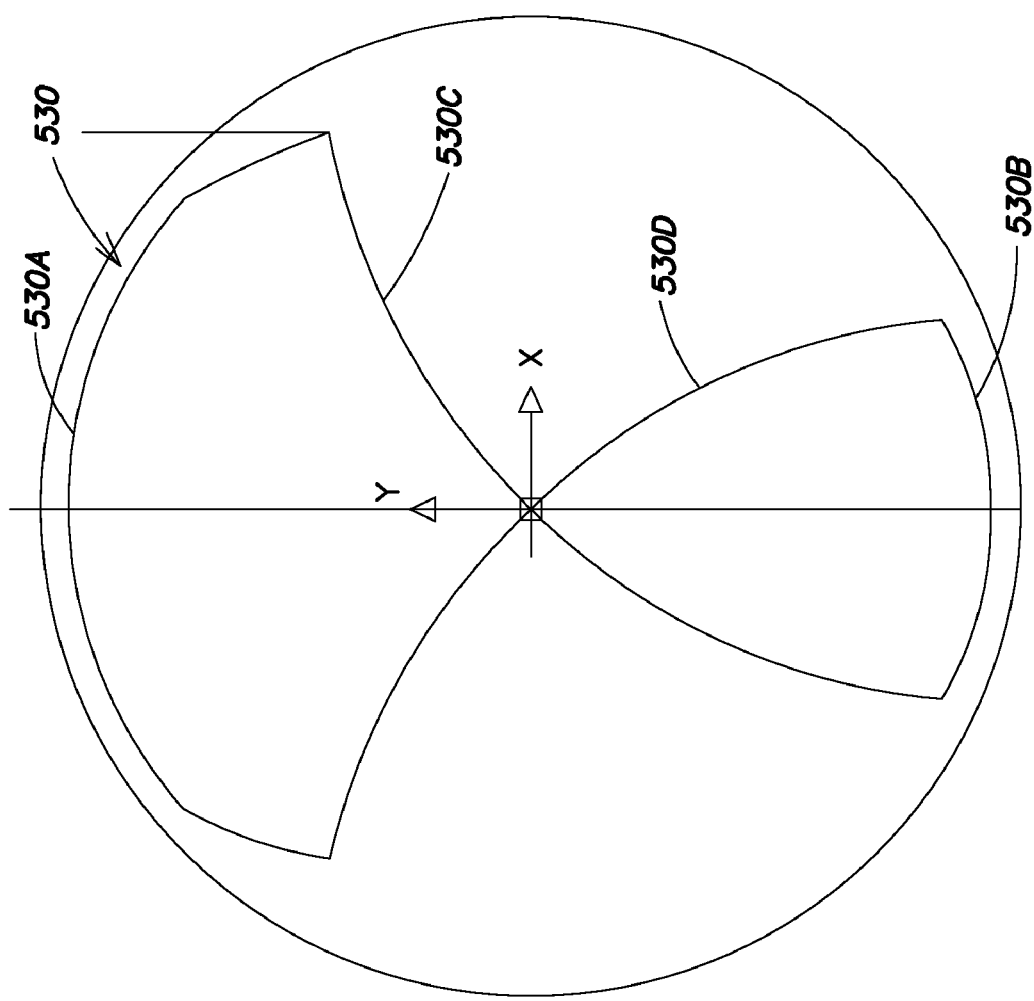
Figure 5C:
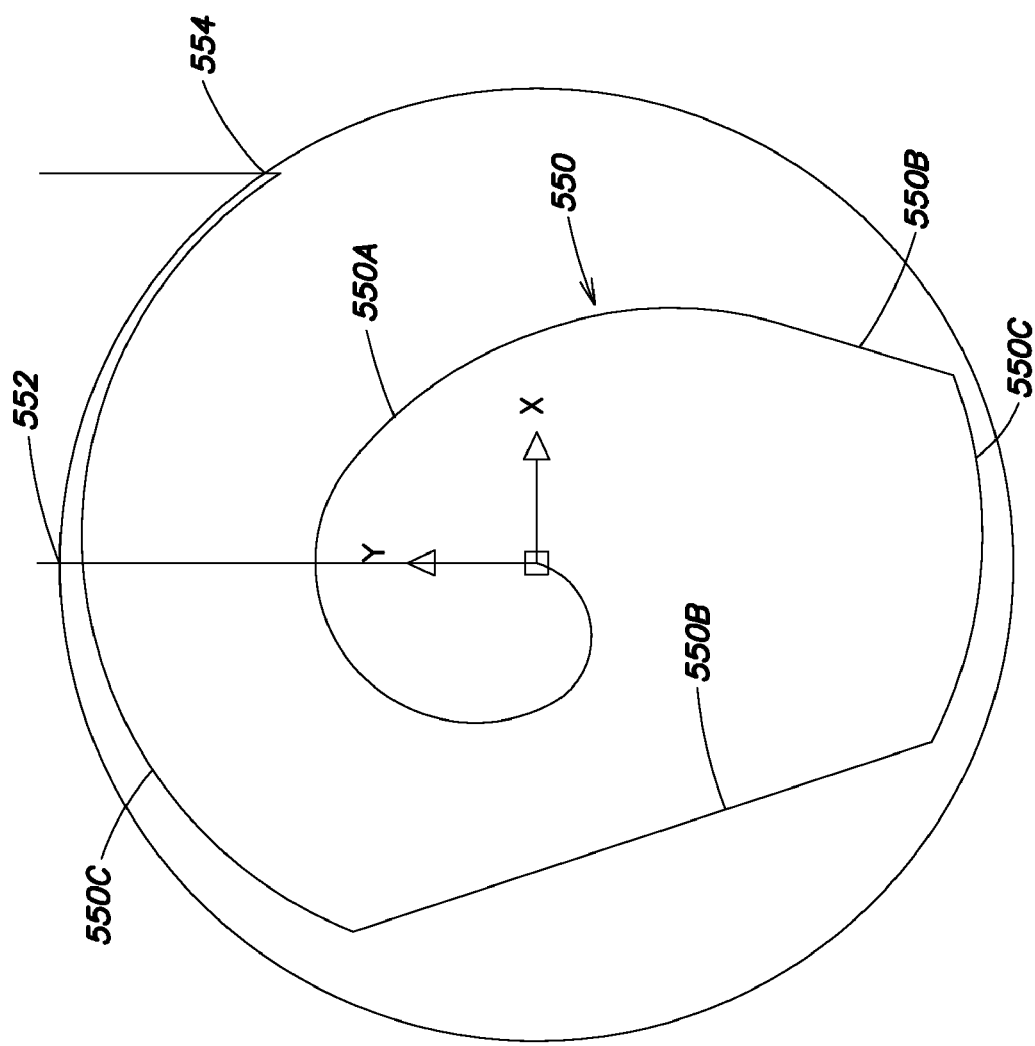

FIGS. 5A through 5C depict various examples of process motion profiles. The large circle in each of FIGS. 5A through 5C represents the edges of a substrate while the lines labeled 530, 540, and 550 within the large circles represent motion path profiles of the substrate relative to the metrology sensor (i.e., the path sensed by the sensor as the substrate is moved underneath). FIG. 5A depicts an example of a "FIG. 8" process motion profile with curvilinear sensing path segments 530A and 530B of different arc lengths positioned at opposed sides which are interconnected by segments 530C and 530D which pass through and cross in the interior. FIG. 5B depicts an example of a "forward and back" process motion profile whereby the path 540 includes forward path segments 540A, reverse path segments 540B, and transition segments 540C. FIG. 5C depicts an example of a "spiral" process motion profile having a spiral path segment 550A in the interior connected to combinations of linear segments 550B and curvilinear segments 550C (e.g., arc segments).

In each of the aforementioned examples, the robot 102A (FIG. 1-4) may function as a motion stage by executing a process motion profile. The process motion profile may include a curvilinear motion such as by a combination of a translation motion as imparted by robot motion along the X axis designated by arrow 106 (FIG. 1) and a rotation imparted by robot motion of the robot shoulder designated by arrow 108 (FIG. 1). Optionally, shoulder motion of the robot may be locked and a combination of translation along arrow 106 and rotation by the elbow as designated by arrow 109 may be commanded to accomplish the desired motion profile. Similarly, the X axis, Z Axis, and motion along arrow 110 may be locked thereby limiting the range of motion, and only allowing curvilinear motion in the horizontal plane (X-Y plane) due to motion of the shoulder and/or the elbow.

In further embodiments, all the axes and joints but the shoulder joint may be locked with the substrate being positioned over the center of the robot's shoulder. Rotation of the shoulder about arrow 108 thereby may cause rotation motion about the center of the substrate only. This rotation motion may also be combined with linear motion along the X axis (along arrow 106), for example. Similarly, only linear horizontal motion (e.g., along the X axis only) may be allowed by limiting motion of all other joints. Optionally, in some embodiments, the wrist of the robot may cause an inversion of the substrate. In such an inversion, the blade 104 may include an edge gripping function or a suction, for example. For each of the described paths, an entry 552 and exit 554 (only labeled in FIG. 5C) are connected concurrently to legs of a transfer path in a transfer mode from one system component to another system component within the factory interface. However, it should be recognized that the process mode may occur at any point along the transfer pat, such as at the beginning or end of the transfer path.

Figure 6:
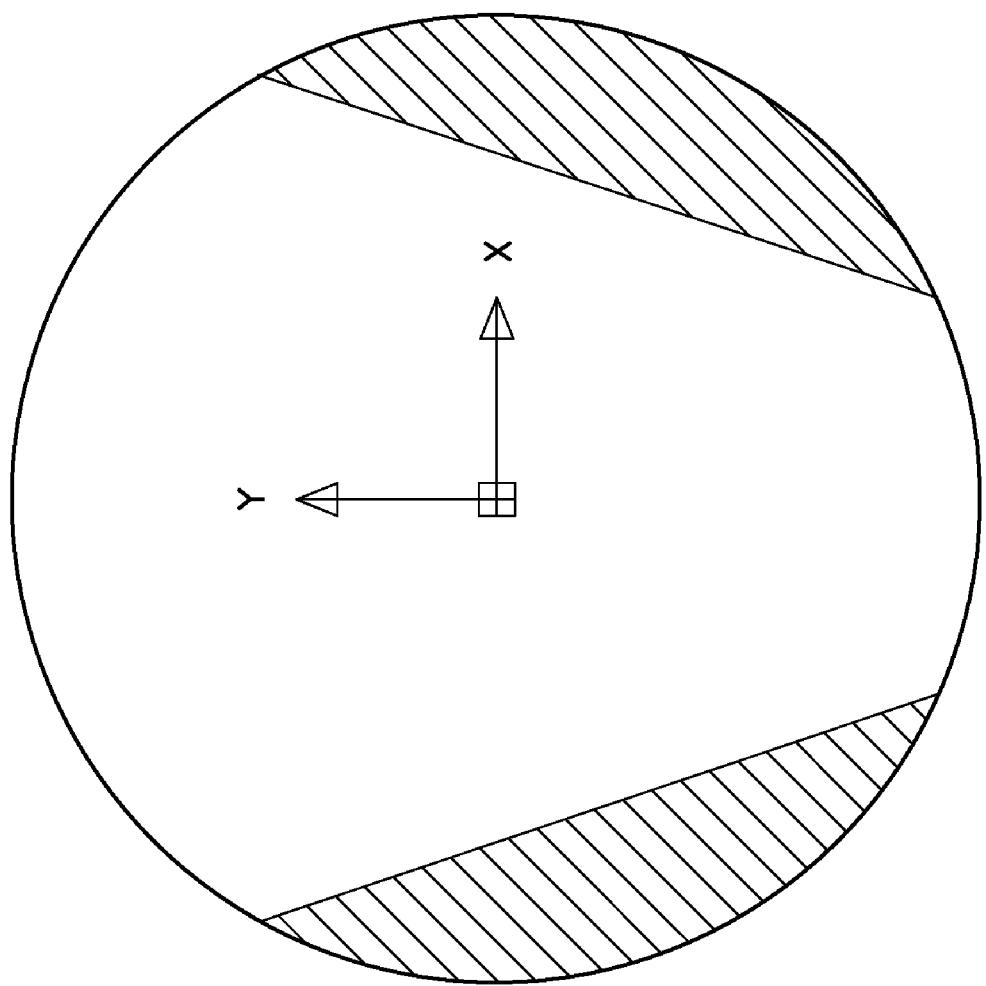
FIG. 6 depicts an example of areas of a substrate that may not be accessible to a process when the present invention is implemented in an existing factory interface.

FIG. 6 depicts an example of areas of a substrate that may not be accessible to a motion-dependent process (e.g., scanning by a WL sensor) when the present invention is implemented in an existing factory interface. The limited room available in an existing factory interface, modified to implement the present invention, may preclude moving all areas of a substrate under the WL sensor.

Figure 7A:
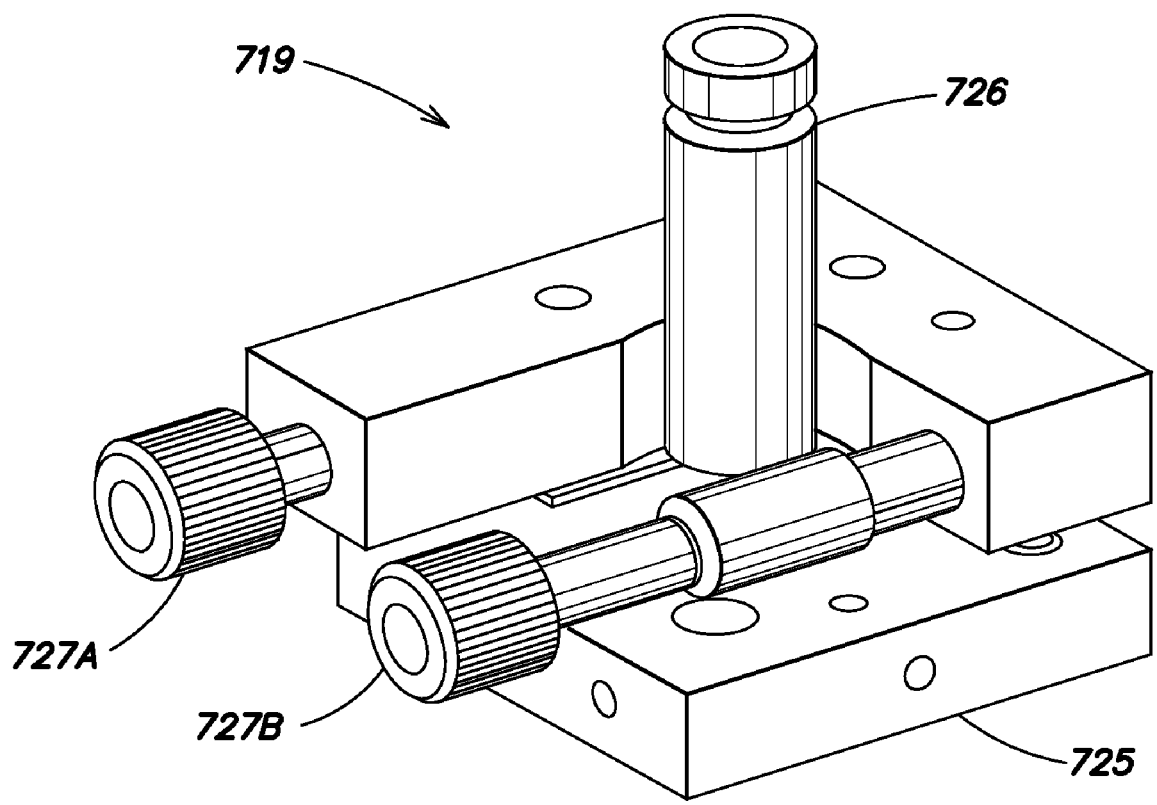
FIGS. 7A to 7C depict different views of an example WL sensor suitable for use with an example metrology process embodiment of the present invention.
Figure 7B:
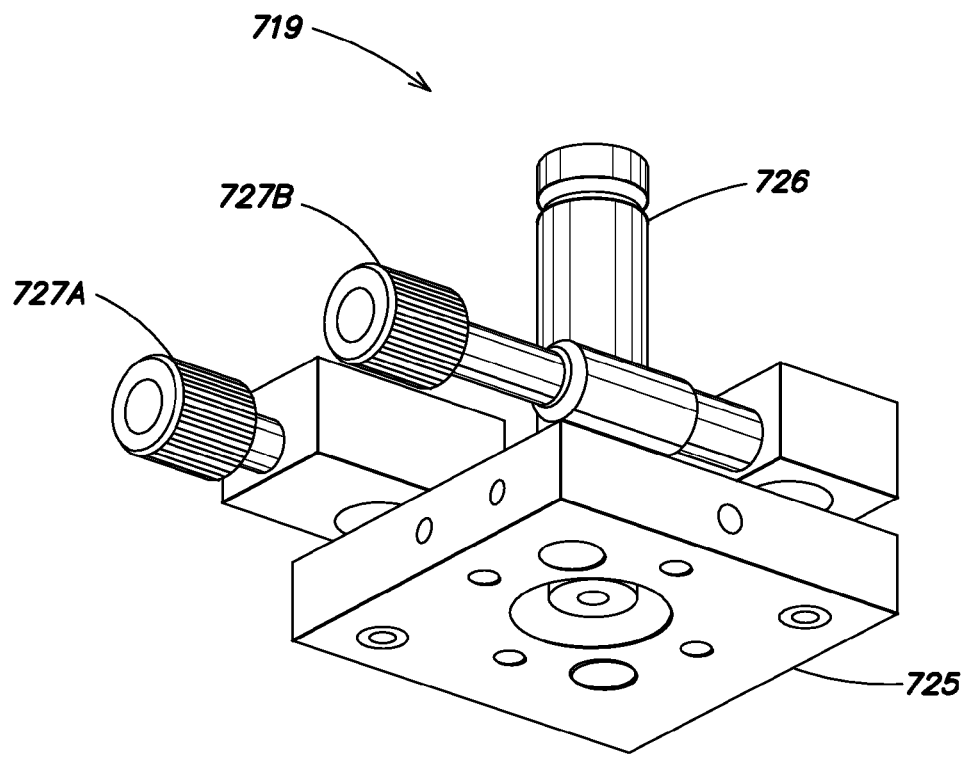
Figure 7C:
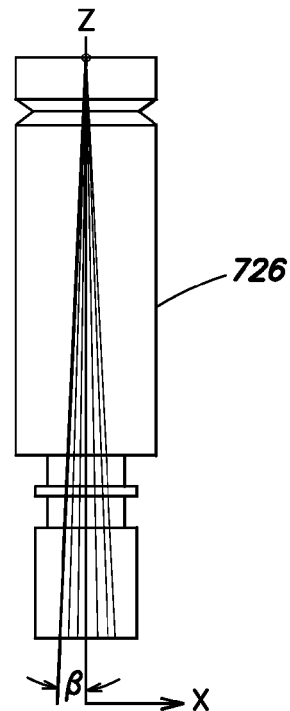

FIG. 7A to FIG. 7C depict different views of an example WL sensor 719 suitable for use with the example metrology process embodiment described above. In particular, the sensor 719 may mount to the sub-frame 120 (FIG. 3). The depicted WL sensor 719 may include a mounting plate 725 for attaching to the sub-frame 120 (FIG. 3) and a sensing element 726 adjustably mounted to the plate 725. As illustrated, fine adjustment mechanisms 727A, 727B may allow some angle ($\beta$) of tilt of the sensing element 726 relative to the plate 725 and the Z axis in the Z-X plane and the X-Y plane (only the Z-X plane is shown). A suitable controller (not shown) may be employed to process the WL signal and provide metrology output information indicative of a condition of the substrate. Any suitable sensor or tool may be employed and/or mounted in the same fashion as the WL sensor, such as an IMACRO metrology tool, and an IMAP metrology tool. Likewise, any suitable motion-dependent processing equipment may be employed.

Figure 8:
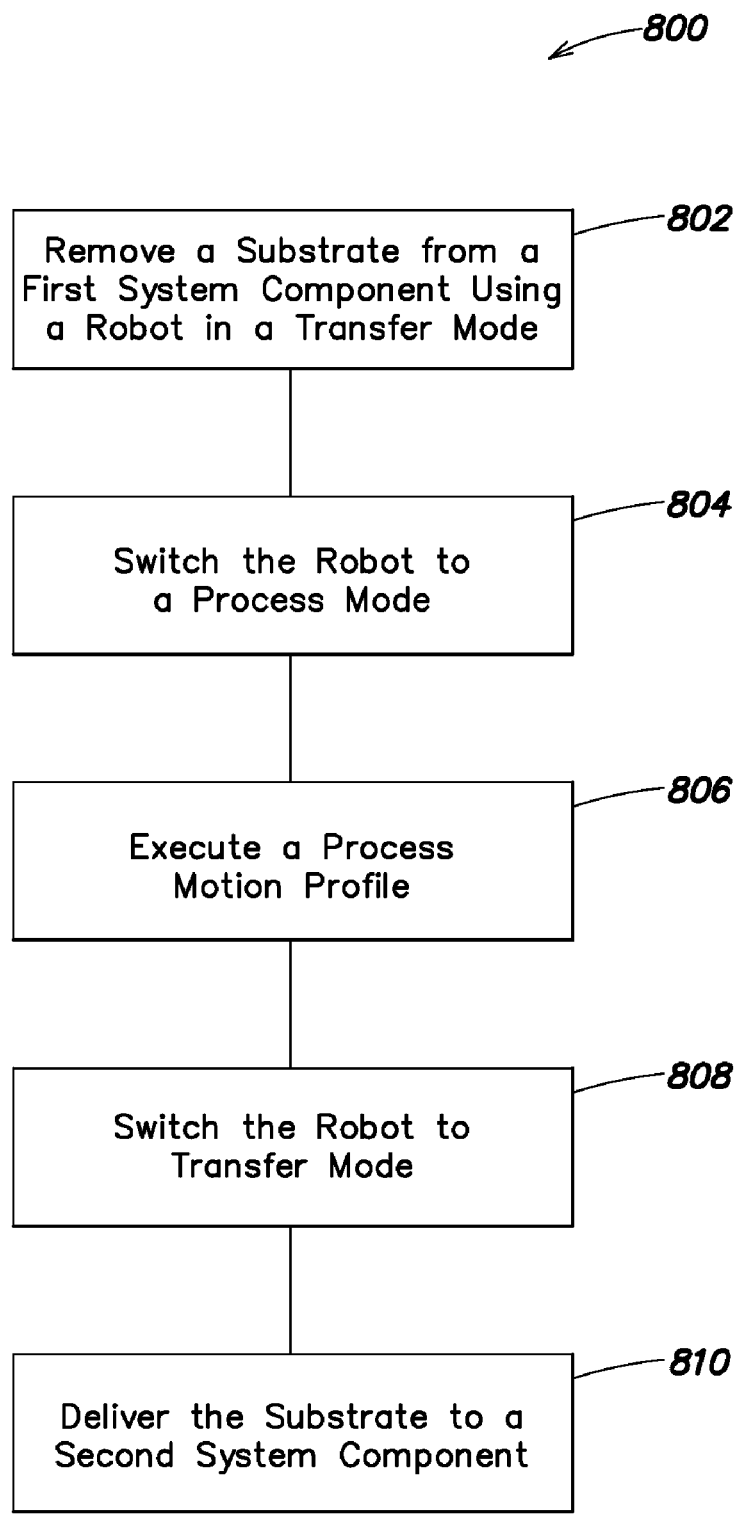
FIG. 8 depicts an exemplary method according to embodiments of the present invention.

FIG. 8 depicts an example of a method 800 according to embodiments of the present invention. In step 802, a factory interface robot, operating in a transfer mode, removes a substrate from a system component such as substrate carrier. In step 804, the robot switches to a process mode. In some embodiments, switching to a process mode may include locking one or more joints of the robot to maximize precision. In step 806, a process motion profile is executed. For example, one of the motion profiles depicted in FIGS. 5A to 5C may be performed under a WL sensor disposed within the factory interface. Other profiles may be implemented as well. In some embodiments the robot may be in a transfer chamber and the processing equipment (e.g., metrology tool, annealing laser, curing tool, etc.) may be disposed in the transfer chamber. In step 808, the robot switches back to the transfer mode. In some embodiments, switching to a transfer mode may include unlocking one or more joints of the robot. In step 810, the robot delivers the substrate to a destination such as to another system component (e.g., a loadport, a process chamber, etc.). The order of operations is not determinative. For example, the execution of the process motion profile may take place at a beginning or an end of the transfer path to the second component.

Figure 9:
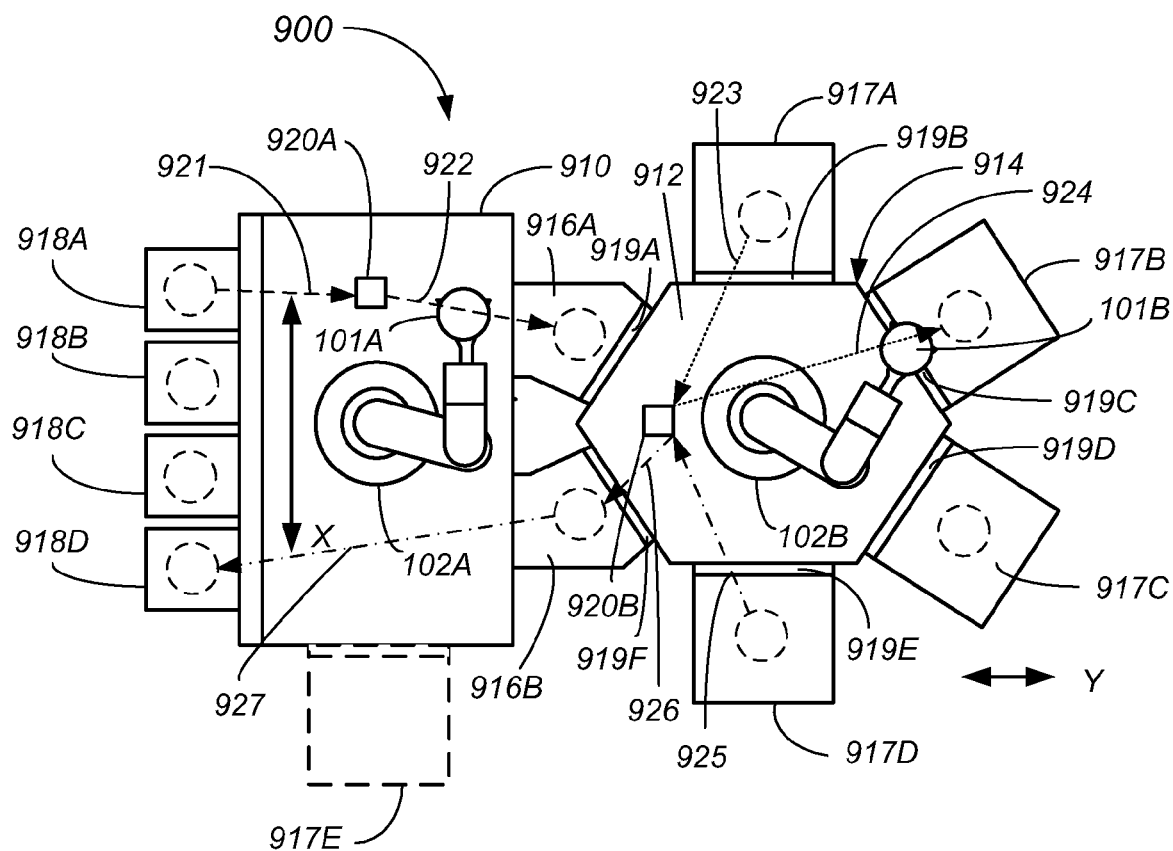
FIG. 9 is a graphical depiction of an exemplary embodiment of the present invention.

FIG. 9 illustrates another embodiment of the dual-mode robot system 900. In the depicted embodiment, dual-mode robots 102A, 102B, as were previously described, may be disposed in the factory interface 910 and/or in the transfer chamber 912. In the depicted embodiment, the dual-mode robots 102A, 102B are included in both. The transfer chamber 912 of a cluster tool 914 may be coupled to the factory interface 910 by one or more loadports 916A, 916B. One or more process chambers 917A-917D may be coupled to the transfer chamber 912. Conventional slit valves 919A-F may be employed in the transfer chamber 912. Moreover, one or more conventional substrate carriers 918A-918D may be coupled to the factory interface 910. Similar to the previously-described embodiments, each of the factory interface 910 and the transfer chamber 912 may include a sensor or substrate processing equipment 920A, 920B. Similarly also, each of the robots 102A, 102B as described above with reference to FIGS. 1-4 may operate in a first mode and a second mode, wherein the first mode is a transfer mode. The second mode may be a process mode, and the robots 102A, 102B may execute a process motion profile relative to the sensor (e.g., a metrology sensor, etc.) or substrate processing equipment (e.g., curing, laser, etc.) 920A, 920B.

For example, within the factory interface 910, the dual mode robot 102A may remove a substrate 101A from a first system component, such as a substrate support of a substrate carrier (e.g., substrate carrier 918A) and transfer the substrate 101A along a first transfer path segment 921 (shown dotted). The robot 102A then switches to a process mode and carries out a motion profile in the proximity of the sensor or substrate process equipment 920A disposed in the factory interface 910. Any suitable motion profile, such as the profile embodiments described with reference to FIG. 5A-5C, may be employed. Following the process mode operation, the robot 102A may again switches into a transfer mode and may transfer the substrate 101A along a second path segment 922 (shown dotted) to a second system component, such as a loadport 916A. Thus, in the depicted example, the robot 102A is adapted to operate in a process mode concurrently with a transfer mode.

In the case where metrology is performed on the substrate 101A, the robot 102A may act as a motion stage for performing the metrology. It should be recognized that the sensor or process equipment 920A may be located at any convenient position along the path between the first and second system component. For example, the sensor or process equipment 920A may be located on the robot base or robot arm, for example. In some embodiments, the robot 102A may place the substrate 102 on a substrate support (not shown) within the factory interface 910 and a sensor mounted on a moving component of the robot 102A may perform the process motion profile before picking up the substrate 101A again and commencing the transfer to the second system component along the remainder of the path. Likewise, the sensor 920A may be disposed in a frame of a loadport 916A, 916B, for example. In accordance with some aspects, at intervals a calibration substrate with known properties may be carried into the factory interface from a storage location and subjected to metrology via carrying out a predetermined motion profile. The response can then be compared to a known (theoretically correct) response and calibration of the robot and/or sensor may then be accomplished.

Within the transfer chamber 912, another robot 102B may be disposed. The robot 102B may be as previously described, but may have Y axis functionality as well. Thus, in this depicted embodiment, the dual-mode robot may carry out a transfer operation in a transfer mode from the loadport 916A or 916B to a process chamber 917A-D, or between respective processing chambers 917A-D. During the transfer, a motion profile may be executed relative to the sensor or processing equipment 920B as previously described with reference to the factory interface 910. As in the previously-described embodiments, the sensor may be included on a part of the robot. Optionally, the sensor may be included in one or more of the slit valves 919A-F, for example. Similarly, the sensor may be positioned within a processing chamber 917A-D and the robot 102B may carry out the motion stage function thereby eliminating the need for a separate motion stage member within the metrology chamber as was required in the prior art.

To further clarify the concurrent operation of the transfer mode and process mode, the following examples are provided. In a first method carried out by the robot 102B, a substrate 101B is removed from a location in a process chamber 917A by the robot 102B and transferred along a first transfer path 923 to the location of the sensor or process equipment 920B. A motion dependent process operation (e.g., metrology) is then executed at the location of the sensor or equipment 920B in a process mode. This is followed by the final transfer leg along path 924 to the second process chamber (e.g., 917B) of a second tool. In another example, the substrate 101B is transferred in a transfer mode from a process chamber of a tool (e.g., 917D) to a sensor 920B along a path 925 (shown dotted). At the sensor 920B, a motion profile is executed in a process mode (e.g., metrology). The substrate 101B then is transferred to the loadport (e.g., 916B) on path 926, to the factory interface 910, and then to a substrate carrier (e.g., 918D) along path 927. The last leg along path 927 is accomplished by robot 102A. Optionally, one or more process chambers (e.g., 917E shown dotted) may be directly coupled to the factory interface 910. Thus in this embodiment, the robot 102A may operate to concurrently transfer the substrate from the chamber of the tool 917E to the sensor 920A where a metrology is carried out and then to a substrate carrier (e.g., 918C).

In any or all of the above described embodiments, the robot may perform the methods of the present invention under the direction of a controller. The controller may be integral to the robot(s) 102A, 102B and/or may be part of a host system that is coupled to the robot(s) 102A, 102B. In either case, the controller may be operative to execute program instructions that direct the robot to function according to the methods of the invention (e.g., switch between a transfer mode and a process mode, perform a process motion profile, perform a substrate transfer, etc.)

The foregoing description discloses only exemplary embodiments of the invention. Modifications of the above disclosed apparatus and method which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention, as defined by the following claims.

What is claimed is:

1. An electronic device manufacturing system, comprising:
a factory interface adapted to receive a substrate carrier;
a robot disposed within the factory interface and adapted to operate in a first mode and a second mode,
wherein, in the first mode, the robot is adapted to transfer a substrate between the substrate carrier and one or more tools,
wherein, in the second mode, the robot is adapted to execute a process motion profile, and the process motion profile is a pre-defined path along which the substrate moves while one or more motion-dependent processes are performed on the substrate, the motion-dependent processes selected from the group of defect inspection, film characterization, laser annealing, laser ablation, laser scribing, electron beam curing, ultraviolet curing, heat curing, inkjet printing, die placement, die registration, die alignment, die manufacturing, component placement, component registration, component alignment, component manufacturing, packaging functions, and
wherein one or more joints of the robot are locked during a moving portion of the process motion profile to restrict the robot only to motion commensurate with the motion-dependent process.

2. The system of claim 1 wherein the factory interface further includes substrate processing equipment adapted for use with the robot while the robot executes the process motion profile.

3. The system of claim 1 wherein the robot is adapted to operate in the first and the second mode concurrently.

4. The system of claim 1 wherein the process motion profile is at least one of an annealing scanning profile, an alignment motion profile, a film characterization motion profile, a defect inspection motion profile, a curing motion profile, a registration motion profile, and a die placement profile.

5. An electronic device manufacturing system, comprising:
a factory interface adapted to receive a substrate carrier;
a robot disposed within the factory interface and adapted to operate in a first mode and a second mode,
wherein, in the first mode, the robot is adapted to transfer a substrate between the substrate carrier and one or more tools, and wherein, in the second mode, the robot is adapted to execute a defect inspection process motion profile, wherein the defect inspection process motion profile is a pre-defined path along which the substrate moves while one or more motion-dependent processes are performed on the substrate, wherein the motion-dependent process is defect inspection, and wherein the robot is adapted to function as a stage for performing defect inspection on the substrate; and wherein one or more joints of the robot are locked during a moving portion of the defect inspection process motion profile to restrict the robot only to motion commensurate with the motion-dependent process; and a defect inspection sensor disposed within the factory interface and adapted to output information about the substrate when the robot operates in the second mode.

6. The system of claim 5 wherein the robot is adapted to function as a stage by limiting a range of motion of the substrate to curvilinear motion in a horizontal plane.

7. The system of claim 5 wherein the robot is adapted to function as a stage by restricting motion of the robot via locking one or more joints of the robot to only permit the substrate to be moved in a linear horizontal motion and a horizontal rotational motion about a center point of the substrate.

8. The system of claim 5 wherein the robot is adapted to function as a stage by limiting a range of motion of the substrate to linear horizontal motion, horizontal rotational motion about a center point of the substrate, and inversion of the substrate.

9. The system of claim 5 wherein the robot is adapted to function as a stage by limiting a range of motion of the substrate to linear horizontal motion, horizontal rotational motion about a center point of the substrate, and vertical motion.

10. The system of claim 5 wherein the defect inspection sensor includes at least one of a white light metrology tool, an IMACRO metrology tool, and an IMAP metrology tool.

11. The system of claim 10 wherein the defect inspection sensor within the factory interface is disposed in at least one of a loadport frame, a slit valve, a factory interface chamber, and on the robot.

12. The system of claim 5 further including a calibration substrate adapted to provide a known response to the defect inspection sensor.

13. A substrate transfer apparatus, comprising:
a robot disposed within a factory interface and adapted to operate in a transfer mode and a process mode,
wherein, in the transfer mode, the robot is adapted to transfer a substrate between a substrate carrier and one or more tools, and
wherein, in the process mode, the robot is adapted to execute a process motion profile, wherein the process motion profile is a pre-defined path along which the substrate moves while one or more motion-dependent processes are performed on the substrate, the motion-dependent processes selected from the group of defect inspection, film characterization, laser annealing, laser ablation, laser scribing, electron beam curing, ultraviolet curing, heat curing, inkjet printing, die placement, die registration, die alignment, die manufacturing, component placement, component registration, component alignment, component manufacturing, packaging functions, and the robot is adapted to function as a stage for performing a process on the substrate; and wherein one or more joints of the robot are locked during a moving portion of the process motion profile to restrict the robot only to motion commensurate with the motion-dependent process; and a process tool disposed within the reach of the robot operating in the process mode and adapted to apply a process to the substrate when the robot operates in the process mode.

14. The apparatus of claim 13 wherein the robot is adapted to operate in the process mode concurrently with the transfer mode.

15. A method for manufacturing an electronic device, comprising the steps of:
removing a substrate from a first system component selected from a group consisting of a tool, a substrate carrier, and a factory interface;
transferring the substrate along a predefined path per a process motion profile to a second system component selected from a group of a tool, a factory interface, and a substrate carrier while one or more motion-dependent processes are performed on the substrate, the motion dependent processes selected from the group of defect inspection, film characterization, laser annealing, laser ablation, laser scribing, electron beam curing, ultraviolet curing, heat curing, inkjet printing, die placement, die registration, die alignment, die manufacturing, component placement, component registration, component alignment, component manufacturing, packaging functions;
locking one or more joints of a robot transferring the substrate during a moving portion of the process motion profile to restrict the robot only to motion commensurate with the motion-dependent process; and
performing metrology on the substrate as the substrate is transferred from the first system component to the second system component.

16. The method of claim 15 wherein the first system component is a tool and the second system component is a tool.

17. The method of claim 15 wherein the first system component is a substrate carrier and the second system component is a tool.

18. The method of claim 15 wherein the first system component is a tool and the second system component is a factory interface.

19. A method of calibrating a robot, comprising the steps of:
calibrating a robot for transferring substrates;
loading a defect inspection calibration substrate on the robot;
locking one or more joints of the robot during a moving portion of a defect inspection motion profile to restrict the robot only to motion commensurate with a motion-dependent defect inspection process, wherein the defect inspection motion profile is a pre-defined path along which the substrate moves while the motion-dependent defect inspection process is performed on the substrate; and
calibrating the robot for performing defect inspection.

* * * * *